US011025277B2

(12) United States Patent
Ma et al.

(10) Patent No.: US 11,025,277 B2
(45) Date of Patent: Jun. 1, 2021

(54) DATA PROCESSING METHOD, DATA PROCESSING APPARATUS, AND COMMUNICATIONS DEVICE

(71) Applicant: HUAWEI TECHNOLOGIES CO., LTD., Guangdong (CN)

(72) Inventors: Liang Ma, Shanghai (CN); Xiaojian Liu, Shenzhen (CN); Chen Zheng, Shanghai (CN); Yuejun Wei, Shanghai (CN); Xin Zeng, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 15 days.

(21) Appl. No.: 16/563,396

(22) Filed: Sep. 6, 2019

(65) Prior Publication Data

US 2019/0393896 A1 Dec. 26, 2019

Related U.S. Application Data

(63) Continuation of application No. PCT/CN2018/077786, filed on Mar. 1, 2018.

(30) Foreign Application Priority Data

Mar. 9, 2017 (CN) .......................... 201710140122.4

(51) Int. Cl.
*H03M 13/11* (2006.01)
(52) U.S. Cl.
CPC .... *H03M 13/1174* (2013.01); *H03M 13/1111* (2013.01); *H03M 13/1131* (2013.01)
(58) Field of Classification Search
CPC ................................................. H03M 13/1174

USPC ................................. 714/752, 751, 754, 756
See application file for complete search history.

(56) References Cited

U.S. PATENT DOCUMENTS

| 6,789,227 | B2 | 9/2004 | De Souza et al. | |
| 7,769,344 | B1 * | 8/2010 | Harvey | H04N 21/818 |
| | | | | 455/39 |
| 7,890,834 | B2 | 2/2011 | Blankenship et al. | |
| 8,711,885 | B1 * | 4/2014 | Harvey | H04N 21/00 |
| | | | | 370/509 |
| 10,742,370 | B2 * | 8/2020 | Bai | H04B 17/101 |
| 2009/0312676 | A1 * | 12/2009 | Rousso | A61F 7/10 |
| | | | | 601/15 |

(Continued)

FOREIGN PATENT DOCUMENTS

| CN | 101188428 A | 5/2008 |
| CN | 103973315 A | 8/2014 |
| CN | 105811996 A | 7/2016 |

OTHER PUBLICATIONS

Gallager, "Low-density parity-check codes," IRE Transactions on Information Theory, vol. 8, Issue, Jan. 1962, 8 pages.
(Continued)

*Primary Examiner* — Fritz Alphonse
(74) *Attorney, Agent, or Firm* — Fish & Richardson P.C.

(57) ABSTRACT

This application provides a data processing method, a data processing apparatus, and a communications device. The data processing method includes: coding a first bit sequence, to obtain a second bit sequence, where the first bit sequence includes a first information bit and a first padding bit, and the second bit sequence includes a second information bit and a redundant bit; and storing the second bit sequence in a circular buffer.

20 Claims, 7 Drawing Sheets

(56) References Cited

U.S. PATENT DOCUMENTS

2017/0302294 A1    10/2017  Zeng et al.
2017/0373809 A1*   12/2017  Kim .................. H03M 13/6362
2018/0026663 A1*    1/2018  Wu ................... H03M 13/6362
                                                              714/776

OTHER PUBLICATIONS

PCT International Search Report and Written Opinion issued in International Application No. PCT/CN2018/077786 dated May 9, 2018, 15 pages (with English translation).
Extended European Search Report issued in European Application No. 18763543.8 dated Mar. 5, 2020, 11 pages.
Ericsson, "LDPC Code Design for NR," 3GPP TSG RAN WG1 Meeting #86, R1-166929; Gotehnburg, Sweden, XP051142505, Aug. 22-26, 2016, 10 pages.
Mediatek Inc, "Discussion on LDPC coding scheme of code structure, granularity and HARQ-IR," 3GPP TSG-RAN WG1 #86, R1-167532; Gothenburg, Sweden, XP051142045, Aug. 22-26, 2016, 10 pages.
ZTE et al., "Compact LDPC design for eMBB," 3GPP TSG RAN WG1 AH NR Meeting, R1-1700247; Spokane, USA, XP051207785, Jan. 16-20, 2017, 16 pages.
Office Action issued in Indian Application No. 201937033712 dated Feb. 9, 2021, 7 pages.

* cited by examiner

DATA PROCESSING METHOD, DATA PROCESSING APPARATUS, AND COMMUNICATIONS DEVICE

CROSS-REFERENCE TO RELATED APPLICATIONS

This application is a continuation of International Application No. PCT/CN2018/077786, filed on Mar. 1, 2018, which claims priority to Chinese Patent Application No. 201710140122.4, filed on Mar. 9, 2017. The disclosures of the aforementioned applications are hereby incorporated by reference in their entireties.

TECHNICAL FIELD

This application relates to the communications field, and more specifically, to a data processing method, a data processing apparatus, and a communications device.

BACKGROUND

Gallager first proposed a linear block code referred to as a low-density parity-check (LDPC) code in 1962. A check matrix of the LDPC code is a sparse matrix. An LDPC code whose code length is n and whose information sequence length is k may be uniquely determined by an LDPC check matrix H.

During actual use, an LDPC check matrix having a special structured feature may be used. The check matrix H that is of an LDPC code and that has the special structured feature may be obtained by extending an LDPC base matrix having a quasi-cyclic (QC) structure.

When the LDPC base matrix having the QC structure is extended to obtain a corresponding check matrix, an all-zero matrix with a z×z size can be obtained after all elements whose values are −1 in the LDPC base matrix are extended, and a permutation matrix with a z×z size can be obtained after other elements are extended. The permutation matrix may be obtained after a corresponding quantity of cyclic shifts of an identity matrix I, and the quantity of shifts is equal to a value of a corresponding matrix element.

When the LDPC base matrix is used for coding, an information bit sequence length natively supported by the LDPC base matrix is determined by an extension factor z and a quantity of columns of information bits. If a size of the LDPC base matrix is m×n, where m represents a quantity of rows in the matrix, n represents a quantity of columns in the matrix, and the quantity k of the columns of the information bits is equal to n−m, the information bit sequence length $k_1$ supported by the base matrix is equal to k×z, and correspondingly, a length $n_1$ of a coded bit sequence obtained after coding is equal to n×z.

Generally, a length of a to-be-coded information bit sequence ranges from dozens of bits to hundreds of bits. A problem that needs to be resolved is how to support coding requirements of information bit sequences of various lengths, so as to better improve system coding and decoding performance.

SUMMARY

This application provides a data processing method, a data processing apparatus, and a communications device, to support coding requirements of information bit sequences of various lengths.

According to an aspect, a data processing method is provided. The data processing method includes: coding a first bit sequence, to obtain a second bit sequence, where the first bit sequence includes a first information bit and a first padding bit, and the second bit sequence includes a second information bit and a redundant bit; and storing a part or all of the second bit sequence in a circular buffer.

In the data processing method, an information bit obtained after a padding bit is added can be coded, and therefore information bits of more lengths can be coded.

In addition, in the data processing method, a bit sequence stored in the circular buffer includes no padding bits, so that the circular buffer, especially a limited circular buffer, can store more information bits. Therefore, a bit sequence obtained or sent by a transmit end from the circular buffer can include a larger information amount, so as to improve decoding performance of a receive end. Finally, communication performance can be improved.

In addition, in the data processing method, the circular buffer includes no bit used for padding in a coding process, so that a time of performing rate matching to select a to-be-sent information bit can be reduced, thereby improving communication efficiency.

With reference to the first aspect, in a first possible implementation, the coding a first bit sequence includes: coding the first bit sequence based on a redundant bit column and a first information bit column that are in the first LDPC base matrix, where the first information bit column is a column corresponding to the first information bit in the first LDPC base matrix.

In this implementation, during coding, because the column in information bit columns that corresponds to the first information bit and the redundant bit column that are in the first LDPC base matrix are used, and a column that does not correspond to the first information bit in the information bit columns in the first LDPC base matrix is not used, in other words, not all the information bit columns in the first LDPC base matrix may be used, coding efficiency can be improved, and therefore communication efficiency is improved.

With reference to the first possible implementation, in a second possible implementation, the data processing method further includes: determining a length F of the first padding bit based on a length K of the first information bit and a shortest input sequence length that is in an input sequence length set $\{K_0, K_1, \ldots, K_i, \ldots\}$ and that is greater than K, where $K_i = z_i \cdot k$, k is a quantity of information bit columns in the first LDPC base matrix, and $z_i$ belongs to an extension factor set $\{z_0, z_1, \ldots, z_i, \ldots\}$ supported by the first LDPC base matrix; and padding the first information bit with the first padding bit whose length is F, to obtain the first bit sequence.

With reference to the second possible implementation, in a third possible implementation, the coding the first bit sequence based on a redundant bit column and a first information bit column that are in the first LDPC base matrix includes: deleting a column other than the first information bit column and the redundant bit column in the first LDPC base matrix based on the length F of the first padding bit and a first extension factor, to obtain a second LDPC base matrix, where the first extension factor is an extension factor corresponding to the shortest input sequence length in the extension factor set $\{z_0, z_1, \ldots, z_i, \ldots\}$; and coding, based on the first extension factor and the second LDPC base matrix, the first information bit and a bit that is in the first padding bit and that corresponds to the first information bit column.

With reference to the first possible implementation, in a fourth possible implementation, the data processing method further includes: determining a first extension factor and a length F of the first padding bit based on a quantity of information bit columns in the first LDPC base matrix, a maximum column-deleting quantity supported by the first LDPC base matrix, an extension factor set supported by the first LDPC base matrix, and a length of the first information bit; and padding the first information bit with the first padding bit whose length is F, to obtain the first bit sequence.

With reference to the fourth possible implementation, in a fifth possible implementation, the coding the first bit sequence based on a redundant bit column and a first information bit column that are in the first LDPC base matrix includes: deleting a column other than the first information bit column and the redundant bit column in the first LDPC base matrix based on the quantity of information bit columns in the first LDPC base matrix, the length of the first information bit, and the first extension factor, to obtain a second LDPC base matrix; and coding, based on the first extension factor and the second LDPC base matrix, the first information bit and a bit that is in the first padding bit and that corresponds to the first information bit column.

With reference to the first aspect, in a sixth possible implementation, the coding a first bit sequence includes: coding the first bit sequence based on a first LDPC base matrix.

According to a second aspect, a data processing method is provided. The data processing method includes: obtaining soft information of a third bit sequence, where the third bit sequence is selected by a transmit end from a circular buffer of the transmit end, bits stored in the circular buffer include a part or all of a second bit sequence, the second bit sequence is obtained by the transmit end by coding a first bit sequence, the first bit sequence includes a first information bit and a first padding bit, and the second bit sequence includes a second information bit and a redundant bit; storing the soft information in a soft information buffer; adding padding information to first soft information, to obtain second soft information, where the first soft information is the soft information in the soft information buffer; and decoding the second soft information.

In the data processing method, because the third bit sequence is obtained and sent by the transmit end from the second bit sequence including no padding bits, the third bit sequence can include a larger information amount, so that decoding performance can be improved, and finally, communication performance can be improved.

With reference to the second aspect, in a first possible implementation, the decoding the second soft information includes: decoding the second soft information based on a redundant bit and a first information bit column that are in the first LDPC base matrix, where the first information bit column is a column corresponding to the first information bit in the first LDPC base matrix.

In this implementation, during decoding, because the column in information bit columns that corresponds to the first information bit and the redundant bit column that are in the first LDPC base matrix are used, and a column that does not correspond to the first information bit in the information bit columns in the first LDPC base matrix is not used, in other words, not all the information bit columns in the first LDPC base matrix may be used, decoding efficiency can be improved, and therefore communication efficiency is improved.

With reference to the first possible implementation, in a second possible implementation, the adding padding information to first soft information, to obtain second soft information includes: determining a length F of the padding information based on a length K of the first soft information and a shortest input sequence length that is in an input sequence length set $\{K_0, K_1, \ldots, K_i, \ldots\}$ and that is greater than K, where $K_i = z_i \cdot k$, k is a quantity of information bit columns in the first LDPC base matrix, and $z_i$ belongs to an extension factor set $\{z_0, z_1, \ldots, z_i, \ldots\}$ supported by the first LDPC base matrix; and padding the first soft information with the padding information whose length is F, to obtain the second soft information.

With reference to the second possible implementation, in a third possible implementation, the decoding the second soft information based on a redundant bit and a first information bit column that are in the first LDPC base matrix includes: deleting a column other than the first information bit column and the redundant bit column in the first LDPC base matrix based on the length F of the padding information and a first extension factor, to obtain a second LDPC base matrix, where the first extension factor is an extension factor corresponding to the shortest input sequence length in the extension factor set $\{z_0, z_1, \ldots, z_i, \ldots\}$; and decoding, based on the first extension factor and the second LDPC base matrix, the first soft information and information that is in the padding information and that corresponds to the first information bit column.

With reference to the first possible implementation, in a fourth possible implementation, the adding padding information to first soft information, to obtain second soft information includes: determining a first extension factor and a length F of the padding information based on a quantity of information bit columns in the first LDPC base matrix, a maximum column-deleting quantity supported by the first LDPC base matrix, an extension factor set supported by the first LDPC base matrix, and a length of the first soft information; and padding the first soft information with the padding information whose length is F, to obtain the second soft information.

With reference to the fourth possible implementation, in a fifth possible implementation, the decoding the second soft information based on a redundant bit and a first information bit column that are in the first LDPC base matrix includes: deleting a column other than the first information bit column and the redundant bit column in the first LDPC base matrix based on the quantity of information bit columns in the first LDPC base matrix, the length of the first soft information, and the first extension factor, to obtain a second LDPC base matrix; and decoding, based on the first extension factor and the second LDPC base matrix, the first soft information and information that is in the padding information and that corresponds to the first information bit column.

With reference to the second aspect, in a sixth possible implementation, the decoding the second soft information includes: decoding the second soft information based on a first LDPC base matrix.

According to a third aspect, a data processing apparatus is provided, and the data processing apparatus includes modules configured to perform the data processing method in the first aspect or any possible implementation of the first aspect.

According to a fourth aspect, a data processing apparatus is provided, and the data processing apparatus includes modules configured to perform the data processing method in the second aspect or any possible implementation of the second aspect.

According to a fifth aspect, a data processing apparatus is provided, including a processor. Optionally, the data processing apparatus may further include a receiver and a transmitter. The processor is configured to execute code. When the code is executed, the processor implements the data processing method in the first aspect or any possible implementation of the first aspect.

According to a sixth aspect, a data processing apparatus is provided, including a processor. Optionally, the data processing apparatus may further include a receiver and a transmitter. The processor is configured to execute code. When the code is executed, the processor implements the data processing method in the second aspect or any possible implementation of the second aspect.

According to a seventh aspect, a computer readable medium is provided, where the computer readable medium stores program code executed by a data processing apparatus, and the program code includes an instruction used to perform the data processing method in the first aspect or any possible implementation of the first aspect.

According to an eighth aspect, a computer readable medium is provided, where the computer readable medium stores program code executed by a data processing apparatus, and the program code includes an instruction used to perform the data processing method in the second aspect or any possible implementation of the second aspect.

According to a ninth aspect, a computer program product including an instruction is provided. When the computer program product runs on a data processing apparatus, the data processing apparatus is enabled to perform the data processing method in the first aspect or any possible implementation of the first aspect.

According to a tenth aspect, a computer program product including an instruction is provided. When the computer program product runs on a data processing apparatus, the data processing apparatus is enabled to perform the data processing method in the second aspect or any possible implementation of the second aspect.

According to an eleventh aspect, a communications device is provided, and the communications device includes the data processing apparatus according to the third aspect or the fifth aspect.

According to a twelfth aspect, a communications device is provided, and the communications device includes the data processing apparatus according to the fourth aspect or the sixth aspect.

DESCRIPTION OF EMBODIMENTS

The following describes technical solutions in this application with reference to accompanying drawings.

Figure 1:
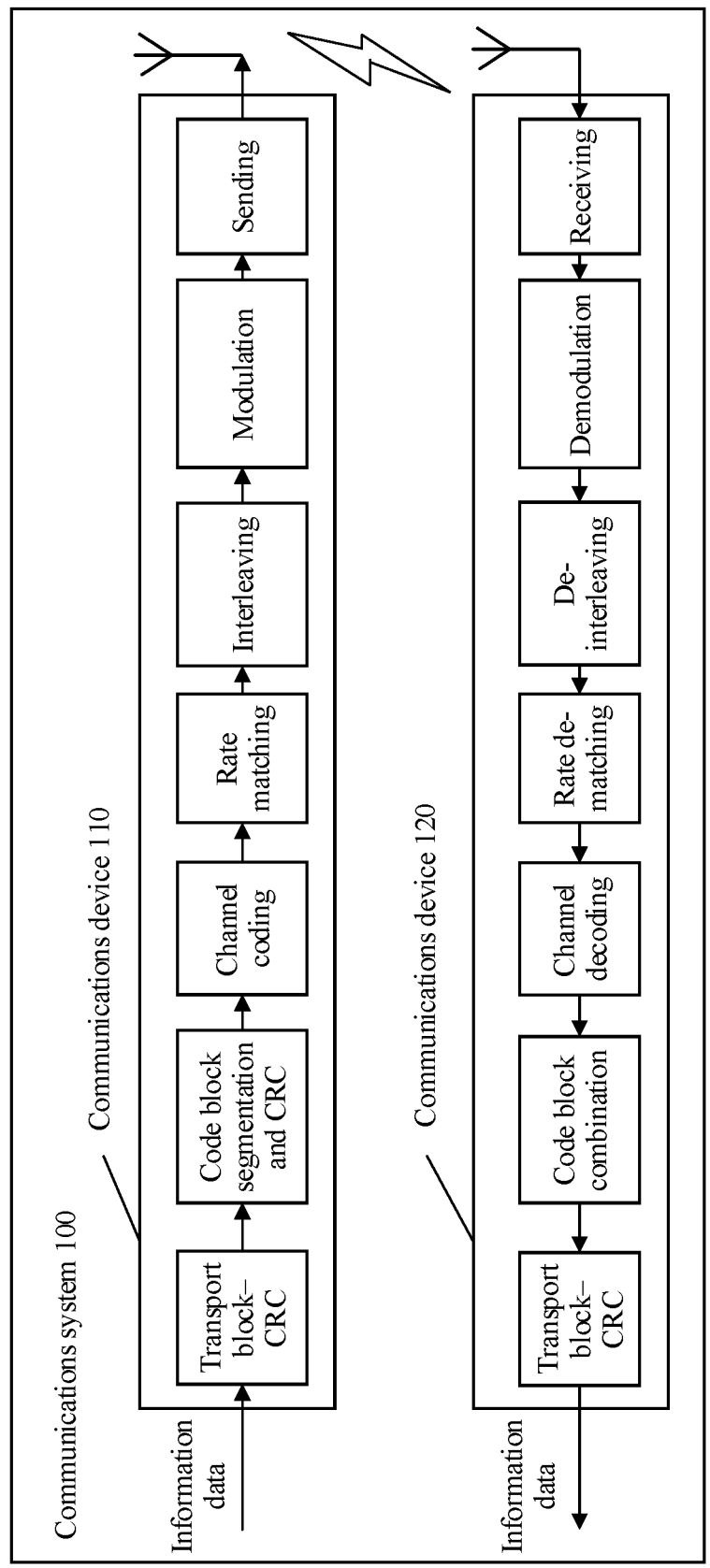
FIG. 1 is a schematic architectural diagram of a communications system to which a data processing method and a communications system in embodiments of this application are applicable.

FIG. 1 is a schematic architectural diagram of a communications system to which the technical solutions in this application are applicable. The communications system 100 shown in FIG. 1 includes a communications device 110 and a communications device 120.

It should be understood that embodiments of this application are not limited to the system architecture shown in FIG. 1. In addition, an apparatus in FIG. 1 may be hardware, functionally divided software, or a combination thereof.

When sending information data, the communications device 110 may divide the information data into a plurality of transport blocks (TB) based on a supported transport block size, and add CRC check to each transport block. If a size of the transport block after the check is added exceeds a maximum code block length, the transport block needs to be divided into several code blocks (CB). Code block-CRC check may be added to each code block, or a padding bit may be added.

The communications device 110 performs channel coding such as LDPC coding on each code block, to obtain a corresponding coded code block. Each coded code block includes a plurality of information bits existing before the coding and check bits generated through coding, which are collectively referred to as coded bits.

The coded bits are stored (may be directly stored, or may be stored after interleaving) in a circular buffer of the communications device 110. The communications device 110 selects a segment of coded bits from the circular buffer, maps the coded bits to a modulation symbol, and sends the modulation symbol.

When retransmission occurs, the communications device 110 selects another coded bit segment from the circular buffer for sending. If all data in the circular buffer has been transmitted once, a coded bit is selected again from a front end of the circular buffer.

After demodulating a received modulation symbol, the communications device 120 stores a soft value of a received coded bit at a corresponding location in a soft information buffer. If retransmission occurs, the communications device 120 merges and stores soft values of coded bits in all retransmissions in the soft information buffer. The merging herein means that if locations of coded bits received in two transmissions are the same, soft values of the coded bits received in the two transmissions are merged. The communications device 120 decodes all soft values in the soft information buffer to obtain information bit data.

In the embodiments of this application, the communications device 110 may be a network device such as a base station in the communications system, and correspondingly, the communications device 120 may be a terminal. To facilitate understanding, the following describes some nouns related to this application.

In this application, nouns "network" and "system" are usually interchangeably used, but meanings of the nouns may be understood by a person skilled in the art.

The terminal is a device having a communication function, and may include a handheld device, an in-vehicle device, a wearable device, a computing device, another processing device connected to a wireless modem, or the like that has a wireless communication function. The terminal may have different names in different networks, for example, user equipment, a mobile station, a subscriber unit, a station, a cellular phone, a personal digital assistant, a wireless modem, a wireless communications device, a handheld device, a laptop computer, a cordless phone, and a wireless local loop station. For ease of description, these devices are simply referred to as the terminal in this application.

The base station (BS), which may be referred to as a base station device, is a device that connects a terminal to a wireless network, and includes but is not limited to a transmission reception point (TRP), an evolved NodeB (eNB), a radio network controller RNC), a NodeB (NB), a base station controller (BSC), a base transceiver station (BTS), a home eNodeB (for example, a home evolved NodeB or a home node B, HNB), a baseband unit (BBU), or a Wi-Fi access point (AP).

Figure 2:
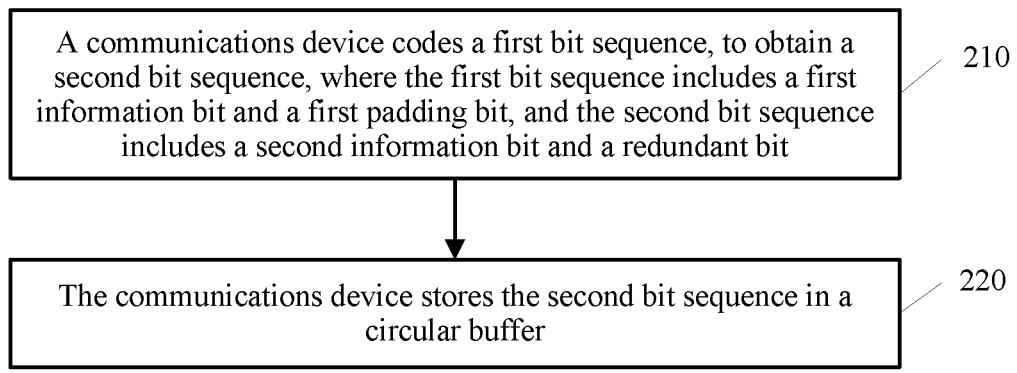
FIG. 2 is a schematic flowchart of a data processing method according to an embodiment of this application.

FIG. 2 is a schematic flowchart of a data processing method according to an embodiment of this application. It should be understood that FIG. 2 shows steps or operations of the data processing method, but these steps or operations are merely examples. Another operation or variation of each operation in FIG. 2 may be further performed in this embodiment of this application.

The data processing method shown in FIG. 2 may be performed by a channel coding module in the communications device 110 shown in FIG. 1, or in other words, may be performed by the communications device 110. The channel coding module may be also referred to as a coder or a data processing module. The following describes the data processing method in this embodiment of this application by using an example in which the communications device is an execution body.

S210. The communications device codes a first bit sequence, to obtain a second bit sequence, where the first bit sequence includes a first information bit and a first padding bit, and the second bit sequence includes a second information bit and a redundant bit.

The first information bit is a bit in a to-be-coded information sequence, for example, a bit in an information sequence obtained by performing code block segmentation. The first padding bit is a bit used as a known bit (for example, 0) for coding in a coding process. The second information bit may be the first information bit. In other words, an information bit in the second bit sequence that is obtained through coding may be the same as an information bit in the first bit sequence existing before the coding. The redundant bit is a bit other than the information bit in the second bit sequence obtained through coding.

It should be noted that the second bit sequence includes no padding bits.

In the data processing method, an information bit obtained after a padding bit is added can be coded, and therefore information bits of more lengths can be coded.

That the first bit sequence includes the first information bit and the first padding bit may be understood as follows:

The first padding bit is added to the first information bit, to obtain the first bit sequence. Specifically, a length F of the first padding bit may be determined based on a length K of the first information bit, and then the first padding bit whose length is F is added to the first information bit, so that the first bit sequence can be obtained.

In S210, optionally, that the communications device codes the first bit sequence, to obtain the second bit sequence may include: performing, by the communications device, LDPC coding on the first bit sequence based on a first LDPC base matrix, to obtain the second bit sequence.

Before a possible implementation in which the communications device performs LDPC coding on the first bit sequence based on the first LDPC base matrix to obtain the second bit sequence is described, the following first describes a possible implementation in which the first padding bit is added to the first information bit.

The communications device determines an input sequence length set $\{K_0, K_1, \ldots, K_i, \ldots\}$ natively supported by the first LDPC base matrix, where i is a positive integer.

The communications device may calculate the input sequence length set $\{K_0, K_1, \ldots, K_i, \ldots\}$ based on an extension factor set $\{z_0, z_1, \ldots, z_{i_{max}}\}$ and according to $K_i = z_i \cdot k$, where k is a quantity of information bit (or referred to as a system bit) columns in the first LDPC base matrix, and the extension factor set $\{z_0, z_1, \ldots z_{i_{max}}\}$ may be prestored in the communications device.

Alternatively, the communications device may prestore the input sequence length set $\{K_0, K_1, \ldots, K_i, \ldots\}$ natively supported by the first LDPC base matrix. For example, the communications device may prestore a correspondence between each extension factor in the extension factor set and an input sequence length in the input sequence length set supported by the first LDPC base matrix.

The communications device finds a shortest input sequence length K' that is in the input sequence length set $\{K_0, K_1, \ldots, K_i, \ldots\}$ and that is greater than K, and may obtain F according to F=K'−K.

The communications device pads the first information bit with the first padding bit whose length is F, to obtain the first bit sequence.

When the communications device adds the first padding bit to the first information bit, a padding manner is: padding a tail of the first information bit with the first padding bit. Certainly, another location of the first information bit may be padded with the first padding bit. This is not limited in this embodiment of this application.

In addition, the communications device determines an extension factor corresponding to K' in the extension factor set $\{z_0, z_1, \ldots, z_{i_{max}}\}$ as a first extension factor. In this way, the communications device may code the first bit sequence based on the first extension factor and the first LDPC base matrix.

The following uses an example in which the first LDPC base matrix is a matrix with a bidiagonal structure or a lower triangular structure to describe a specific implementation in which the communications device performs LDPC coding on the first bit sequence based on the first LDPC base matrix, to obtain the second bit sequence.

In the following specific implementation, the first bit sequence is s, the first LDPC base matrix is $H_b$, and the first extension factor is z.

The LDPC base matrix $H_b$ with the bidiagonal structure may be divided into two parts, in other words, $(H_b)_{m_b \times n_b} = [(H_s)_{m_b \times k_b} | (H_e)_{b_b \times m_b}]$, where $H_s$ corresponds to an information bit (or referred to as a system bit), $H_e$ corresponds to a check bit (or referred to as a redundant bit), and $k_b=(n_b-m_b)$.

$H_e$ may be divided into two parts: $H_e=[H_{e1}\ H_{e2}]$, where a size of $H_{e1}$ is $m_b \times 1$, values of three elements are not equal to −1, and the three elements are respectively located in a zeroth row, an $(m_b-1)^{th}$ row, and an $x(1 \le x \le m_b-2)^{th}$ row. Values of elements in the zeroth row and the $(m_b-1)^{th}$ row are all equal to $a(1 \le a \le z=1)$, and a value of an element in the $x^{th}$ to row is 0. $H_{e2}$ has a bidiagonal structure. When i=j and i=j+1, a value of an element in an $i^{th}$ row and a $j^{th}$ column is 0, and values of elements at all remaining locations are −1. $H_e$ may be specifically represented as follows:

$$H_e = [H_{e1}\quad H_{e2}] = \begin{bmatrix} a & 0 & & & & \\ \vdots & 0 & 0 & & & \\ 0 & & 0 & \ddots & & \\ \vdots & & & \ddots & 0 & \\ \vdots & & & & 0 & 0 \\ a & & & & & 0 \end{bmatrix}, 1 \le a \le z-1.$$

s is divided into $k_b$ groups based on an extension factor z of a check matrix, each group has z bits, and a vector obtained after grouping is as follows: $s=[s(0), s(1), \ldots, s(k_b-1)]$, where each subvector $s(i)=[s_{iz}, s_{iz+1}, \ldots, s_{iz+z-1}]$, $0 \le i \le k_b-1$.

Likewise, a check vector e is divided into $m_b$ groups, each group has z bits, and a vector that can be obtained is as follows: $e=[e(0), e(1), \ldots, e(m_b-1)]$, where each subvector $e(i)=[e_{iz}, e_{iz+1}, \ldots e_{iz+z-1}]$, $0 \le i \le m_b-1$.

According to the foregoing grouping, a coding process may be divided into the following two steps.

In a first step, initialization is performed, all rows in $H \cdot [s\ e]^T=0$ are added, and a duplicate item is removed, to obtain e(0), in other words, $$e(0) = \sum_{j=0}^{k_b-1} \sum_{i=0}^{m_b-1} P_{i,j} \cdot [s(j)]^T,$$

where $P_{i,j}$ represents a cyclic shift matrix corresponding to a cyclic shift coefficient $P_{i,j}$ in an $i^{th}$ row and a $j^{th}$ column in the base matrix $H_b$.

In a second step, values from e(1) to $e(m_b-1)$ are calculated through recursion based on the bidiagonal structure of $H_{e2}$, where $$e(i+1) = \begin{cases} \left[\sum_{j=0}^{k_b-1} P_{i,j}s(j) + P_{i,k_b}e(0)\right], i = 0 \\ \left[\sum_{j=0}^{k_b-1} P_{i,j}s(j) + P_{i,k_b}e(0)\right] + e(i), i = 1, 2, \ldots, m_b-2 \end{cases}.$$

According to the foregoing two steps, e(1) to $e(m_b-1)$ can be calculated, all check bits are obtained, and a code word x=[s e] existing after coding is obtained by combining the check bits with s, so that the coding process is completed. e is a redundant bit.

If the LDPC base matrix is a matrix $H_b$ with the lower triangular structure, $H_b$ may be also divided into two parts, in other words, $H_b=[(H_s)_{m_b \times k_b}|(H_e)_{m_b \times m_b}]$, where $H_s$ corresponds to a system bit (or referred to as an information bit), $H_e$ corresponds to a lower triangular matrix check bit (or referred to as a redundant bit), and $k_b=(n_b-m_b)$.

The base matrix $H_b$ which $H_e$ is an $m_b \times m_b$ lower triangular matrix is as follows:

$$H_b = [H_s | H_e] = \begin{bmatrix} p_{0,0} & \cdots & p_{0,k_b-1} & p_{0,k_b} & -1 & -1 & -1 & -1 & -1 \\ p_{1,0} & \cdots & p_{1,k_b-1} & p_{1,k_b} & p_{1,k_b+1} & -1 & -1 & -1 & -1 \\ p_{2,0} & \cdots & p_{2,k_b-1} & p_{2,k_b} & p_{2,k_b+1} & p_{2,k_b+2} & -1 & -1 & -1 \\ \vdots & \ddots & \vdots & \vdots & \vdots & \vdots & \ddots & -1 & -1 \\ p_{m_b-2,0} & \cdots & p_{m_b-2,k_b-1} & p_{m_b-2,k_b} & p_{m_b-2,k_b+1} & p_{m_b-2,k_b+2} & \cdots & p_{m_b-2,n_b-2} & -1 \\ p_{m_b-1,0} & \cdots & p_{m_b-1,k_b-1} & p_{m_b-1,k_b} & p_{m_b-1,k_b+1} & p_{m_b-1,k_b+2} & \cdots & p_{m_b-1,n_b-2} & p_{m_b-1,n_b-1} \end{bmatrix}.$$

s is divided into $k_b$ groups based on an extension factor z of a check matrix, each group has z bits, and a vector obtained after grouping is as follows: $s=[s(0), s(1), \ldots, s(k_b-1)]$, where each subvector $s(i)=[s_{iz}, s_{iz+1}, \ldots, s_{iz+z-1}]$, $0 \le i \le k_b-1$.

Likewise, a check vector e is divided into $m_b$ groups, each group has z bits, and a vector that can be obtained is as follows: $e=[e(0), e(1), \ldots, e(m_b-1)]$, where each subvector $e(i)=[e_{iz}, e_{iz+1}, \ldots, e_{iz+z-1}]$, $0 \le i \le m_b-1$.

According to the foregoing grouping, the following recursive manner is used in a coding process of an LDPC code with a lower triangular structure.

In a first step, e(0) is initialized, and a check equation corresponding to a first row in the base matrix meets: $[P_{0,0}, P_{0,1}, \ldots, P_{0,k_b-1}|P_{0,k_b}] \cdot [s|e(0)]^T=0$, where $P_{i,j}$ represents a cyclic shift matrix corresponding to a cyclic shift coefficient $P_{i,j}$ in an $i^{th}$ row and a $j^{th}$ column in the base matrix $H_b$.

$e(0)=P_{0,k_b}^{-1} \cdot [P_{0,0}, P_{0,1}, \ldots P_{0,k_b-1}] \cdot [s]^T$ may be obtained by transforming the foregoing equation.

In a second step, values from e(1) to $e(m_b-1)$ are calculated through recursion based on the lower triangular structure of $H_e$, where $e(i+1)=P_{i+1, k_b+i+1}^{-1} \cdot [P_{i+1,0}, P_{i+1,1}, \ldots, P_{i+1,k_b-1}|P_{i+1,k_b}, \ldots, P_{i+1,k_b+1}] \cdot [s|e(0), \ldots, e(i)]^T$, and $0 \le i \le k_b-2$.

According to the foregoing two steps, e(0) to $e(m_b-1)$ can be calculated, all check bits are obtained, and a code word x=[s e] existing after coding is obtained by combining the check bits with the information sequence s, so that the coding process is completed. e is a redundant bit.

If the first LDPC base matrix includes a bidiagonal matrix and a lower triangular matrix, or includes a lower triangular matrix, when coding is performed based on the first LDPC base matrix, coding may be separately performed according to coding methods in a matrix with a bidiagonal structure and a matrix with a lower triangular structure, and finally, coded bits obtained after the coding are combined, so that a final coding result can be obtained.

After coding the first bit sequence based on the first LDPC base matrix, and obtaining a coded bit sequence $d_0$, $d_1, \ldots, d_{N-1}$ whose length is N, the communications device may delete the first padding bit in the coded bit sequence, for example, delete a bit marked as <NULL>, to obtain the second bit sequence.

For example, when the first padding bit included in the first bit sequence is located at the tail of the first information bit, $d_i$, K≤i<K+F in the coded bit sequence $d_0, d_1, \ldots, d_{N-1}$ obtained by coding the first bit sequence may be deleted, to obtain the second bit sequence $d_i$, 0≤i<K, K+F≤i<N. It should be noted that if the first padding bit is inserted into the another location of the first information bit, this step needs to be accordingly modified.

In S210, optionally, that the communications device codes the first bit sequence, to obtain the second bit sequence may specifically include: coding, by the communications device, the first bit sequence based on a redundant bit column and a first information bit column that are in a first LDPC base matrix, to obtain the second bit sequence, where the first information bit column is a column corresponding to the first information bit in the first LDPC base matrix.

The redundant bit column is a column to which a redundant bit or a check bit belongs in the first LDPC base matrix, and the information bit column is a column to which a system bit or an information bit belongs in the first LDPC base matrix.

The first information bit column may mean that the first bit sequence is divided into $k_b$ groups, each group has z bits, vectors $s=[s(0), s(1), \ldots, s(k_b-1)]$ obtained after grouping are in a one-to-one correspondence with $k_b$ information bit columns in the first LDPC base matrix, and a column that is in the $k_b$ information bit columns in the first LDPC base matrix and that corresponds to a vector including an information bit (in other words, including not only a padding bit) in $s=[s(0), s(1), \ldots, s(k_b-1)]$ is the first information bit column. z is an extension factor used when coding is performed based on the first LDPC base matrix.

If each vector in $s=[s(0), s(1), \ldots, s(k_b-1)]$ includes an information bit, in other words, there is no vector including only a padding bit, the first information bit column includes all information bit columns in the first LDPC base matrix.

If there is a vector including only a padding bit in $s=[s(0), s(1), \ldots, s(k_b-1)]$, in other words, there is a vector including no information bit, the first information bit column includes only some vectors in the first LDPC base matrix. In this case, the "coding, by the communications device, the first bit sequence based on a redundant bit column and a first information bit column that are in a first LDPC base matrix" may be that only the redundant bit column and some information bit columns in the first LDPC base matrix are actually used to code the first bit sequence, so that coding efficiency can be improved.

In other words, in this implementation, the communications device codes the first bit sequence based on the redundant bit column and the first information bit column that are in the first LDPC base matrix, rather than based on all information bit columns and the redundant bit column that are in the first LDPC base matrix in all cases. Actually, based on a quantity of first information bits in the first bit sequence, the information bit columns in the first LDPC base matrix are flexibly used for coding, so that coding efficiency can be improved.

When the communications device codes the first bit sequence based on the redundant bit column and the first information bit column that are in the first LDPC base matrix, a possible implementation is as follows:

The communications device finds a shortest input sequence length K' that is in an input sequence length set $\{K_0, K_1, \ldots, K_i, \ldots\}$ natively supported by the first LDPC base matrix and that is greater than K, and after obtaining F according to F=K'−K, may further obtain F' according to F'=F mod z, where "mod" represents a modulo operation. Then, only the first padding bit whose length is F' may be added to the first information bit, to obtain the first bit sequence. An implementation in which the communications device determines the input sequence length set $\{K_0, K_1, \ldots, K_i, \ldots\}$ is described above, and details are not described herein again.

When the communications device adds the first padding bit to the first information bit, a padding manner is: padding a tail of the first information bit with the first padding bit. Certainly, another location of the first information bit may be padded with the first padding bit. This is not limited in this embodiment of this application.

In this case, the communications device may code the first bit sequence based on only the redundant bit column and the some information bit columns (namely, the first information bit column) in the first LDPC base matrix.

Specifically, the communications device may obtain $k_1$ according to $$k_1 = \left\lfloor \frac{F}{z} \right\rfloor,$$

then delete $k_1$ first information bit columns in the first LDPC base matrix to obtain a second LDPC base matrix, and perform LDPC coding on the first bit sequence based on the first extension factor and the second LDPC base matrix. "⌊ ⌋" represents rounding down.

For example, when the tail of the first information bit whose length is K is padded with the first padding bit whose length is F, $k_1$ columns starting from a $(k-1)^{th}$ column in the first LDPC base matrix may be deleted forward (namely, in a direction from right to left in the matrix) to obtain the second LDPC base matrix, and then LDPC coding is performed on the first bit sequence based on the first extension factor and the second LDPC base matrix, where k is a quantity of information bit columns in the first LDPC base matrix.

When the communications device performs LDPC coding on the first bit sequence based on the first extension factor and the second LDPC base matrix, for a specific implementation, refer to the foregoing process in which the communications device codes the first bit sequence based on the first extension factor and the first LDPC base matrix. For brevity, details are not described herein.

If the another location of the first information bit is padded with the first padding bit, locations of the $k_1$ information columns to be deleted from the first LDPC base matrix need to be accordingly modified.

After coding the first bit sequence, and obtaining a coded bit sequence $d_0, d_1, \ldots, d_{N-1}$ whose length is N, the communications device may delete the first padding bit in the coded bit sequence, for example, delete a bit marked as <NULL>, to obtain the second bit sequence.

For example, when the first padding bit included in the first bit sequence is located at the tail of the first information bit, $d_i$, $K \le i < K+F'$ in the coded bit sequence $d_0, d_1, \ldots, d_{N-1}$ obtained by coding the first bit sequence may be deleted, to obtain the second bit sequence $d_i$, $0 \le i < K$, $K+F \le i < N$. It should be noted that if the first padding bit is inserted into the another location of the first information bit, this step needs to be accordingly modified.

When the communications device codes the first bit sequence based on the redundant bit column and the first information bit column that are in the first LDPC base matrix, another possible implementation is as follows:

The communications device may preset a maximum column-deleting quantity $\Delta k$ supported by the first LDPC base matrix. Then, the communications device may find an extension factor z (which may be referred to as a first extension factor) meeting $$k - \Delta k \le \frac{K}{z_i} \le k$$

from an extension factor set $\{z_0, z_1, \ldots, z_i, \ldots\}$. k is a quantity of information bit columns in the first LDPC base matrix.

The first extension factor may be a largest extension factor meeting $$k - \Delta k \le \frac{K}{z_i} \le k$$

in $\{z_0, z_1, \ldots, z_i, \ldots\}$, or may be a smallest extension factor meeting $$k - \Delta k \le \frac{K}{z_i} \le k$$

in $\{z_0, z_1, \ldots, z_i, \ldots\}$, or certainly may be another extension factor meeting $$k - \Delta k \le \frac{K}{z_i} \le k$$

in $\{z_0, z_1, \ldots, z_i \ldots\}$.

After determining the first extension factor, the communications device may determine a quantity F of first padding bits based on the first extension factor and the length of the first information bit. Specifically, the communications device may obtain F according to $$F = \left\lceil \frac{k}{z} \right\rceil \cdot z - k,$$

where "$\lceil \ \rceil$" represents rounding up.

After determining F, the communications device may add F padding bits to the first information bit, to obtain the first bit sequence.

When the communications device adds the padding bit to the first information bit, a padding manner is: padding a tail of the first information bit with the first padding bit. Certainly, another location of the first information bit may be padded with the first padding bit. This is not limited in this embodiment of this application.

In this case, the communications device may code the first bit sequence based on only the redundant bit column and the some information bit columns (namely, the first information bit column) in the first LDPC base matrix.

Specifically, the communications device may obtain $k_1$ according to $$k_1 = k - \left\lceil \frac{K}{z} \right\rceil,$$

where k is a quantity of information bit columns in the first LDPC base matrix. Then, the communications device deletes $k_1$ first information bit columns in the first LDPC base matrix to obtain a second LDPC base matrix, and performs LDPC coding on the first bit sequence based on the first extension factor and the second LDPC base matrix.

For example, when the tail of the first information bit is padded with the first padding bit, $$k_1 = k - \left\lceil \frac{K}{z} \right\rceil$$

columns starting from a $(k-1)^{th}$ column in the first LDPC base matrix may be deleted forward (namely, in a direction from right to left in the matrix) to obtain the second LDPC base matrix, and then LDPC coding is performed on the first bit sequence based on the first extension factor and the second LDPC base matrix.

If the another location of the first information bit is padded with the first padding bit, locations of the $k_1$ information bit columns to be deleted from the first LDPC base matrix need to be accordingly modified.

When the communications device performs LDPC coding on the first bit sequence based on the first extension factor and the second LDPC base matrix, for a specific implementation, refer to the foregoing process in which the communications device codes the first bit sequence based on the first extension factor and the first LDPC base matrix. For brevity, details are not described herein.

After coding the first bit sequence, and obtaining a coded bit sequence $d_0, d_1, \ldots, d_{N-1}$ whose length is N, the communications device may delete the first padding bit in the coded bit sequence, for example, delete a bit marked as <NULL>, to obtain the second bit sequence.

For example, when the first padding bit included in the first bit sequence is located at the tail of the first information bit, $d_i$, $K \le i < K+F$ in the coded bit sequence $d_0, d_1, \ldots, d_{N-1}$ obtained by coding the first bit sequence may be deleted, to obtain the second bit sequence $d_i$, $0 \le i < K$, $K+F \le i < N$. It should be noted that if the first padding bit is inserted into the another location of the first information bit, this step needs to be accordingly modified.

S220. The communications device stores the second bit sequence in a circular buffer. This step may be implemented by a coding module of the communications device.

Because the second bit sequence is a bit sequence obtained after the first padding bit is deleted, the bit sequence stored in the circular buffer may include more information bits, so that the circular buffer (especially a limited circular buffer) can store a larger information amount, and therefore a redundant bit segment generated by a rate matcher can include a larger information amount. In this way, after a receive end receives a soft value of a bit, because the received bit includes a larger information amount, decoding performance is higher, and finally, communication performance is also higher.

In addition, bits stored in the circular buffer include no first padding bit, so that in a process in which the rate matcher obtains the redundant bit segment, a time of determining whether a bit is a padding bit to discard the padding bit can be saved. In other words, communication efficiency can be improved.

The communications device may store a part or all of the second bit sequence in the circular buffer.

In the data processing method shown in FIG. 2, after the second bit sequence is stored in the circular buffer, to support requirements for various code lengths and code rates, rate matching may be performed on the bit stored in the circular buffer, to adjust a block length of a to-be-output bit sequence. Usually, a module for implementing rate matching may be referred to as a rate matching module or a rate matcher. The rate matching module may be a component of the foregoing communications device, or may be a component of another communications device.

When performing rate matching, the rate matching module may select different redundancy versions, for example, select a proper start point from $RV_0$ to $RV_4$, and read data in the circular buffer in a sequence of columns. Codes of different code rates may be obtained by adjusting an amount of data being read.

Figure 3:
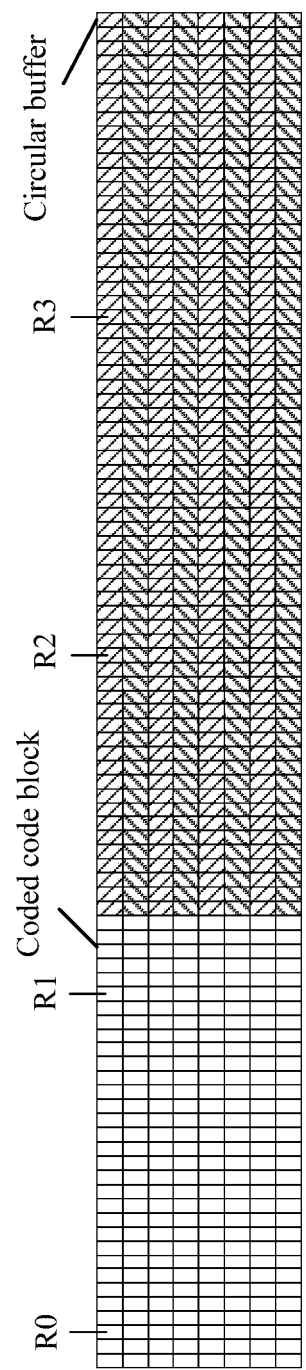
FIG. 3 is a schematic diagram of a full circular buffer according to an embodiment of this application.

For example, in FIG. 3, there are 96 columns in total. If a code block is generated by reading 64 columns from $RV_0$, a code rate obtained after rate matching is $$R = \frac{1/3}{64/96} = 1/2.$$

If 128 columns are read (the beginning of the circular buffer continues to be read cyclically when the end of the circular buffer is read), a code rate obtained after rate matching is $$R = \frac{1/3}{128/96} = 1/4.$$

The circular buffer in a rate matching method shown in FIG. 3 may be also referred to as a full register.

Figure 4:
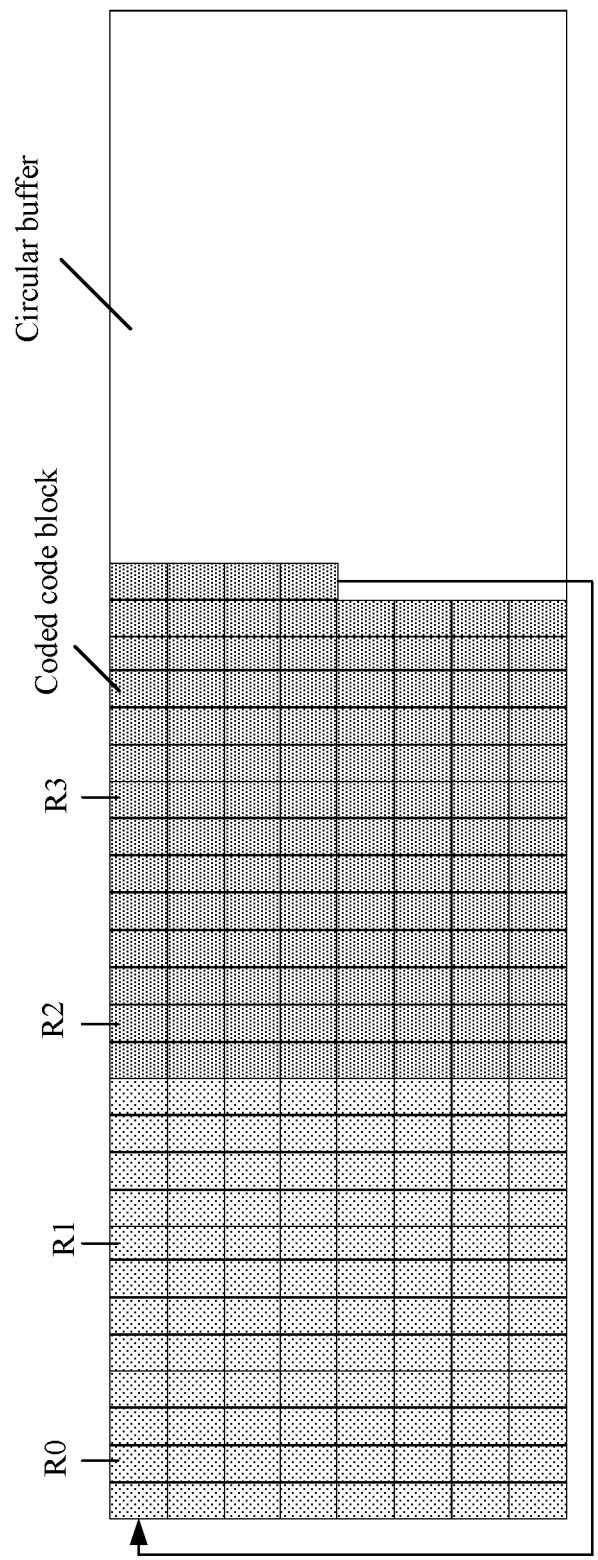
FIG. 4 is a schematic diagram of a limited circular buffer according to an embodiment of this application.

In addition, if the circular buffer is a limited circular buffer, or referred to as a limited register, a limited buffer rate matching (Limited buffer rate matching, LBRM) method may be used, and a definition of a redundancy version of the limited circular buffer is shown in FIG. 4. A feature of the rate matching method for the limited circular buffer is that rate matching may be first performed once to reduce a total redundancy amount, and then an operation is performed according to the rate matching method for the full register, to reduce storage overheads of a receive end (such as a terminal).

When data in the circular buffer (including the full register and the limited register) is read, if a bit is a padding bit (for example, a bit marked as <NULL>), the rate matching module skips the padding bit and attempts to read a bit after the padding bit, until a non-padding bit (for example, a non-<NULL> bit) is found. In this way, it can be ensured that a quantity of valid bits output by the rate matching module is equal to a length of a to-be-output bit sequence. The valid bits output by the rate matching module may be referred to as a third bit sequence.

Optionally, the communications device may send the third bit sequence.

In the data processing method shown in FIG. 2, a maximum block length (namely, a to-be-coded original information bit) supported by the coding module of the communications device is usually fixed (for example, may be 6144). To support a longer information length, a code block segmentation module may be cascaded before the coding module, to segment a bit sequence that exceeds a specified length Z (for example, Z=6144) into a plurality of code blocks for separate coding.

For an original information sequence, if a length of the information sequence after a 24-bit transport block-cyclic redundancy check (TB-CRC) code is added is greater than Z, block division needs to be performed. After the block division, a code block-cyclic redundancy check (CB-CRC) code whose length is L (for example, L=24) may be added to each block.

It is assumed that a total length of a transport block after CRC is added is B', and a quantity of code blocks obtained after segmentation is C. A minimum integer $K=K_{CB}^+$ meeting $C \cdot K \geq B'$ is selected, $K_{CB}^- = K_{CB}^+ - 1$ is defined, and $C^+$, $C^-$ are respectively code block quantities corresponding to lengths $K_{CB}^+$, $K_{CB}^-$. In this case, if C=1, $C^+$=1, $K_{CB}^-$=0, and $C^-$=0; or if C>1, $C^- = C \cdot K_{CB}^+ - B'$ and $C^+ = C - C^-$. K is a valid value in a preset table stored in the communications device.

Figure 5:
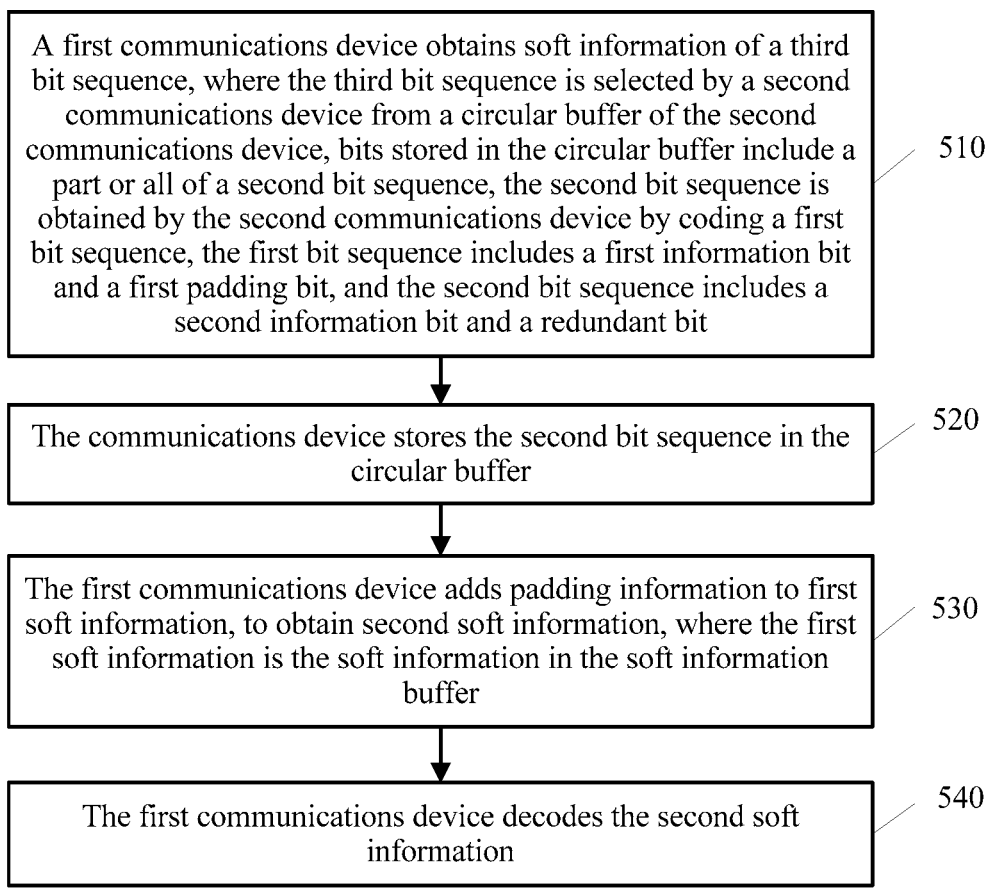
FIG. 5 is a schematic flowchart of a data processing method according to another embodiment of this application.

FIG. 5 is a schematic flowchart of a data processing method according to another embodiment of this application. It should be understood that FIG. 5 shows steps or operations of the data processing method, but these steps or operations are merely examples. Another operation or variation of each operation in FIG. 5 may be further performed in this embodiment of this application.

The data processing method shown in FIG. 5 may be performed by a channel decoding module in the communications device 120 shown in FIG. 1, or in other words, may be performed by the communications device 120. The channel decoding module may be also referred to as a decoder or a data processing module. The following describes the data processing method in this embodiment of this application by using an example in which the communications device is an execution body.

S510. A first communications device obtains soft information of a third bit sequence, where the third bit sequence is selected by a second communications device from a circular buffer of the second communications device, bits stored in the circular buffer include a part or all of a second bit sequence, the second bit sequence is obtained by the second communications device by coding a first bit sequence, the first bit sequence includes a first information bit and a first padding bit, and the second bit sequence includes a second information bit and a redundant bit.

The second communications device may be the communications device in the data communication method shown in FIG. 2. The second communications device may be also referred to as a transmit end. The first communications device may be the communications device 120 in the communications system shown in FIG. 1.

Specifically, that a first communications device obtains soft information of a third bit sequence may include: receiving, by the first communications device, the soft information that is of the third bit sequence and that is sent by another communications device, such as the second communications device.

S520. The first communications device stores the soft information in a soft information buffer.

S530. The first communications device adds padding information to first soft information, to obtain second soft information, where the first soft information is the soft information in the soft information buffer.

S540. The first communications device decodes the second soft information.

In this embodiment of this application, because the third bit sequence is obtained by the second communications device from the second bit sequence, and there is no first padding bit in the second bit sequence, the third bit sequence of a same length may include more information bits. In this way, decoding performance of the first communications device can be improved, so that communication performance can be improved.

For an implementation in which the first communications device adds the padding information to the first soft value information to obtain the second soft information, refer to an implementation in which the first padding bit is added to the first information bit to obtain the first bit sequence in FIG. 2. For brevity, details are not described herein.

In this embodiment of this application, optionally, that the first communications device decodes the second soft information may include: decoding, by the first communications device, the second soft information based on a first LDPC base matrix.

For details of the foregoing step, refer to a corresponding coding procedure in the data processing method shown in FIG. 2. Details are not described herein.

In this embodiment of this application, optionally, that the first communications device decodes the second soft information may include: decoding, by the first communications device, the second soft information based on a redundant bit and a first information bit column that are in a first LDPC base matrix, where the first information bit column is a column corresponding to the first information bit in the first LDPC base matrix.

In this embodiment of this application, optionally, that the first communications device adds padding information to first soft information, to obtain second soft information may include: determining, by the first communications device, a length F of the padding information based on a length K of the first soft information and a shortest input sequence length that is in an input sequence length set $\{K_0, K_1, \ldots, K_i, \ldots\}$ and that is greater than K, where $K_i = z_i \cdot k$, k is a quantity of information bit columns in the first LDPC base matrix, and $z_i$ belongs to an extension factor set $\{z_0, z_1, \ldots, z_i, \ldots\}$ supported by the first LDPC base matrix; and padding, by the first communications device, the first soft information with the padding information whose length is F, to obtain the second soft information.

For details of this step, refer to a procedure in which the communications device determines the length F of the first padding bit based on the length K of the first information bit and the shortest input sequence length that is in the input sequence length set $\{K_0, K_1, \ldots, K_i, \ldots\}$ and that is greater than K in the data processing method shown in FIG. 2. Details are not described herein.

In this embodiment of this application, optionally, the decoding, by the first communications device, the second soft information based on a redundant bit and a first information bit column that are in a first LDPC base matrix may include: deleting, by the first communications device, a column other than the first information bit column and the redundant bit column in the first LDPC base matrix based on the length F of the padding information and a first extension factor, to obtain a second LDPC base matrix, where the first extension factor is an extension factor corresponding to the shortest input sequence length in the extension factor set $\{z_0, z_1, \ldots, z_i, \ldots\}$; and decoding, by the communications device based on the first extension factor and the second LDPC base matrix, the first soft information and information that is in the padding information and that corresponds to the first information bit column.

For details of the foregoing step, refer to a corresponding coding procedure in the data processing method shown in FIG. 2. Details are not described herein.

In this embodiment of this application, optionally, that the first communications device adds padding information to first soft information, to obtain second soft information may include: determining, by the communications device, a first extension factor and a length F of the padding information based on a quantity of information bit columns in the first LDPC base matrix, a maximum column-deleting quantity supported by the first LDPC base matrix, an extension factor set supported by the first LDPC base matrix, and a length of the first soft information; and padding, by the communications device, the first soft information with the padding information whose length is F, to obtain the second soft information.

For details of the foregoing step, refer to a corresponding procedure in the data processing method shown in FIG. 2. Details are not described herein.

In this embodiment of this application, optionally, the decoding, by the first communications device, the second soft information based on a redundant bit and a first information bit column that are in a first LDPC base matrix may include: deleting, by the communications device, a column other than the first information bit column and the redundant bit column in the first LDPC base matrix based on the quantity of information bit columns in the first LDPC base matrix, the length of the first soft information, and the first extension factor, to obtain a second LDPC base matrix; and decoding, by the communications device based on the first extension factor and the second LDPC base matrix, the first soft information and information that is in the padding information and that corresponds to the first information bit column.

For details of the foregoing step, refer to a corresponding procedure in the data processing method shown in FIG. 2. Details are not described herein.

Figure 6:
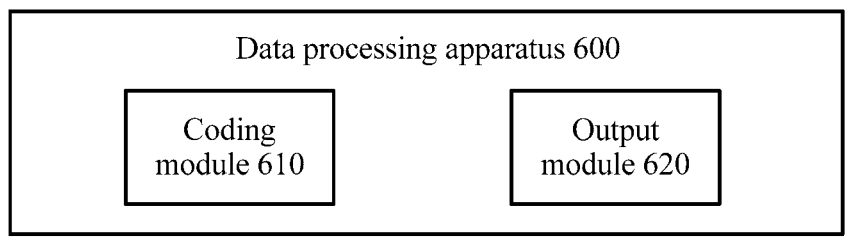
FIG. 6 is a schematic structural diagram of a data processing apparatus according to an embodiment of this application.

FIG. 6 is a schematic structural diagram of a data processing apparatus 600 according to an embodiment of this application. It should be understood that the data processing apparatus 600 shown in FIG. 6 is merely an example. The data processing apparatus in this embodiment of this application may further include another module or unit, or a module with a function similar to that of each module in FIG. 6, or may not necessarily include all modules in FIG. 6.

A coding module 610 is configured to code a first bit sequence, to obtain a second bit sequence, where the first bit sequence includes a first information bit and a first padding bit, and the second bit sequence includes a second information bit and a redundant bit.

An output module 620 is configured to store a part or all of the second bit sequence in a circular buffer.

The data processing apparatus can code an information bit obtained after a padding bit is added, so that information bits of more lengths can be coded.

The data processing apparatus enables a bit sequence stored in the circular buffer to include no padding bits, so that the circular buffer, especially a limited circular buffer, can store more information bits. Therefore, a bit sequence obtained or sent by a communications device from the circular buffer can include a larger information amount, so as to improve decoding performance of a receive end. Finally, communication performance can be improved.

In addition, the data processing apparatus enables the circular buffer to include no bit used for padding in a coding process, so that a time of performing rate matching to select a to-be-sent information bit can be reduced, thereby improving communication efficiency.

Optionally, the data processing apparatus may further include the circular buffer.

Optionally, the coding module may be specifically configured to code the first bit sequence based on a redundant bit column and a first information bit column that are in the first LDPC base matrix, where the first information bit column is a column corresponding to the first information bit in the first LDPC base matrix.

Optionally, the data processing apparatus may further include a padding module 630, configured to: determine a length F of the first padding bit based on a length K of the first information bit and a shortest input sequence length that is in an input sequence length set $\{K_0, K_1, \ldots, K_i, \ldots\}$ and that is greater than K, where $K_i = z_i \cdot k$, k is a quantity of information bit columns in the first LDPC base matrix, and $z_i$ belongs to an extension factor set $\{z_0, z_1, \ldots, z_i, \ldots\}$ supported by the first LDPC base matrix; and pad the first information bit with the first padding bit whose length is F, to obtain the first bit sequence.

Optionally, the coding module may be specifically configured to: delete a column other than the first information bit column and the redundant bit column in the first LDPC base matrix based on the length F of the first padding bit and a first extension factor, to obtain a second LDPC base matrix, where the first extension factor is an extension factor corresponding to the shortest input sequence length in the extension factor set $\{z_0, z_1, \ldots, z_i, \ldots\}$; and code, based on the first extension factor and the second LDPC base matrix, the first information bit and a bit that is in the first padding bit and that corresponds to the first information bit column.

Optionally, the data processing apparatus may further include a padding module 630, configured to: determine a first extension factor and a length F of the first padding bit based on a quantity of information bit columns in the first LDPC base matrix, a maximum column-deleting quantity supported by the first LDPC base matrix, an extension factor set supported by the first LDPC base matrix, and a length of the first information bit; and pad the first information bit with the first padding bit whose length is F, to obtain the first bit sequence.

Optionally, the coding module may be specifically configured to: delete a column other than the first information bit column and the redundant bit column in the first LDPC base matrix based on the quantity of information bit columns in the first LDPC base matrix, the length of the first information bit, and the first extension factor, to obtain a second LDPC base matrix; and code, based on the first extension factor and the second LDPC base matrix, the first information bit and a bit that is in the first padding bit and that corresponds to the first information bit column.

It should be understood that the foregoing and other operations and/or functions of the units of the data processing apparatus shown in FIG. 6 according to this embodiment of this application are respectively intended to implement corresponding procedures performed by the communications device in the communication method in FIG. 2. For brevity, details are not described herein.

Figure 7:
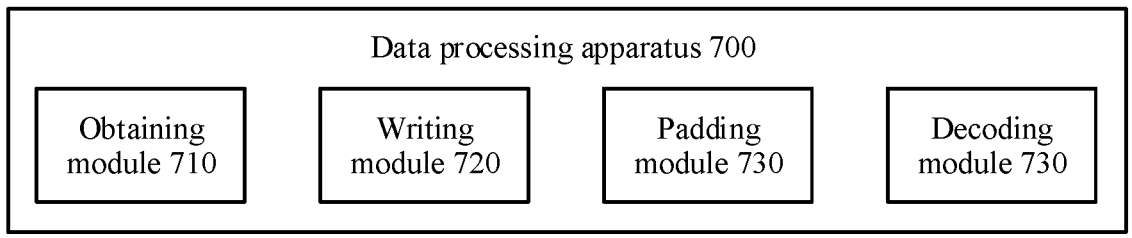
FIG. 7 is a schematic structural diagram of a data processing apparatus according to another embodiment of this application.

FIG. 7 is a schematic structural diagram of a data processing apparatus according to an embodiment of this application. It should be understood that the data processing apparatus 700 shown in FIG. 7 is merely an example. The data processing apparatus in this embodiment of this application may further include another module or unit, or a module with a function similar to that of each module in FIG. 7, or may not necessarily include all modules in FIG. 7.

An obtaining module 710 is configured to obtain soft information of a third bit sequence, where the third bit sequence is selected by a transmit end from a circular buffer of the transmit end, bits stored in the circular buffer include a part or all of a second bit sequence, the second bit sequence is obtained by the transmit end by coding a first bit sequence, the first bit sequence includes a first information bit and a first padding bit, and the second bit sequence includes a second information bit and a redundant bit.

A writing module 720 is configured to store the soft information in a soft information buffer.

A padding module 730 is configured to add padding information to first soft information, to obtain second soft information, where the first soft information is the soft information in the soft information buffer.

A decoding module 740 is configured to decode the second soft information.

Because the third bit sequence obtained by the data processing apparatus is obtained and sent by the transmit end from the second bit sequence including no padding bits, the third bit sequence can include a larger information amount, so that decoding performance can be improved, and finally, communication performance can be improved.

Optionally, the decoding module may be specifically configured to decode the second soft information based on a redundant bit and a first information bit column that are in the first LDPC base matrix, where the first information bit column is a column corresponding to the first information bit in the first LDPC base matrix.

Optionally, the padding module may be specifically configured to: determine a length F of the padding information based on a length K of the first soft information and a shortest input sequence length that is in an input sequence length set $\{K_0, K_1, \ldots, K_i, \ldots\}$ and that is greater than K, where $K_i = z_i \cdot k$, k is a quantity of information bit columns in the first LDPC base matrix, and $z_i$ belongs to an extension factor set $\{z_0, z_1, \ldots, z_i, \ldots\}$ supported by the first LDPC base matrix; and pad the first soft information with the padding information whose length is F, to obtain the second soft information.

Optionally, the decoding module may be specifically configured to: delete a column other than the first information bit column and the redundant bit column in the first LDPC base matrix based on the length F of the padding information and a first extension factor, to obtain a second LDPC base matrix, where the first extension factor is an extension factor corresponding to the shortest input sequence length in the extension factor set $\{z_0, z_1, \ldots, z_i, \ldots\}$; and decode, based on the first extension factor and the second LDPC base matrix, the first soft information and information that is in the padding information and that corresponds to the first information bit column.

Optionally, the padding module may be specifically configured to: determine a first extension factor and a length F of the padding information based on a quantity of information bit columns in the first LDPC base matrix, a maximum column-deleting quantity supported by the first LDPC base matrix, an extension factor set supported by the first LDPC base matrix, and a length of the first soft information; and pad the first soft information with the padding information whose length is F, to obtain the second soft information.

Optionally, the decoding module may be specifically configured to: delete a column other than the first information bit column and the redundant bit column in the first LDPC base matrix based on the quantity of information bit columns in the first LDPC base matrix, the length of the first soft information, and the first extension factor, to obtain a second LDPC base matrix; and decode, based on the first extension factor and the second LDPC base matrix, the first soft information and information that is in the padding information and that corresponds to the first information bit column.

It should be understood that the foregoing and other operations and/or functions of the units of the data processing apparatus shown in FIG. 7 according to this embodiment of this application are respectively intended to implement corresponding procedures performed by the first communications device in the communication method in FIG. 5. For brevity, details are not described herein.

Figure 8:
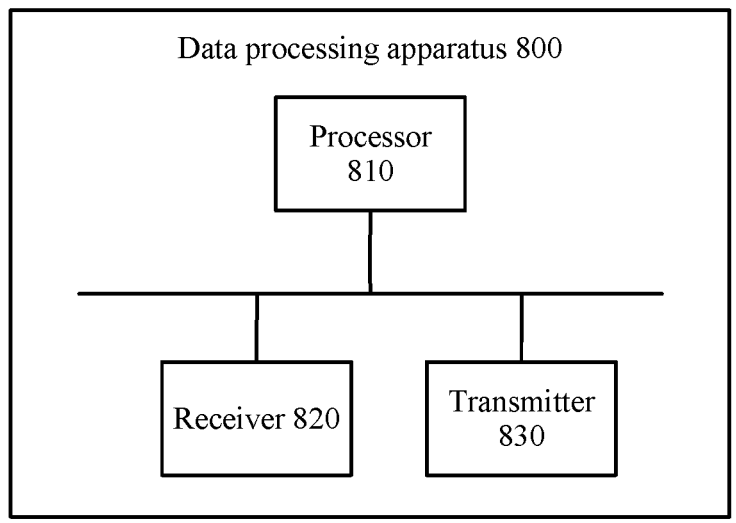
FIG. 8 is a schematic structural diagram of a data processing apparatus according to another embodiment of this application.

FIG. 8 is a schematic structural diagram of a data processing apparatus according to another embodiment of this application. It should be understood that the data processing apparatus 800 shown in FIG. 8 is merely an example. The data processing apparatus in this embodiment of this application may further include another module or unit, or a module with a function similar to that of each module in FIG. 8, or may not necessarily include all modules in FIG. 8.

A processor 810 may be configured to implement operations or steps that can be implemented by the coding module 610 and the output module 620 in FIG. 6. For brevity, details are not described herein.

Optionally, the data processing apparatus 800 may further include a receiver 820 and a transmitter 830. The receiver may be configured to receive information sent by another device, and the transmitter may be configured to send information to another device.

Optionally, the data processing apparatus may further include a circular buffer, configured to store a second bit sequence.

Figure 9:
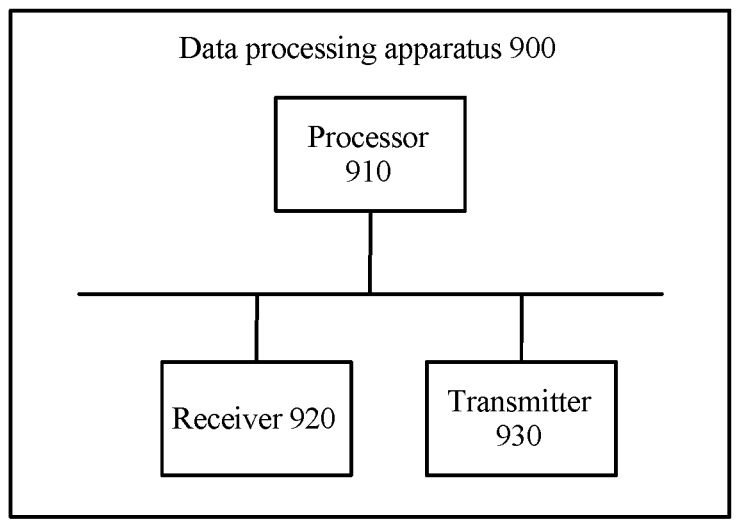
FIG. 9 is a schematic structural diagram of a data processing apparatus according to another embodiment of this application.

FIG. 9 is a schematic structural diagram of a data processing apparatus according to another embodiment of this application. It should be understood that the data processing apparatus 900 shown in FIG. 9 is merely an example. The data processing apparatus in this embodiment of this application may further include another module or unit, or a module with a function similar to that of each module in FIG. 9, or may not necessarily include all modules in FIG. 9.

A processor 910 may be configured to implement operations or steps that can be implemented by the writing module 720, the padding module 730, and the decoding module 740 in FIG. 7, and a receiver 920 may be configured to implement an operation or a step that can be implemented by the obtaining module 710 in FIG. 7. For brevity, details are not described herein.

Optionally, the data processing apparatus 900 may further include a transmitter 930, configured to send information to another device.

Optionally, the data processing apparatus 900 may further include a soft information buffer, configured to store soft information.

Figure 10:
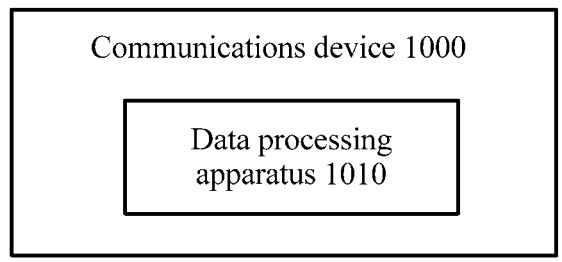
FIG. 10 is a schematic structural diagram of a communications device according to an embodiment of this application.

FIG. 10 is a schematic structural diagram of a communications device according to an embodiment of this application. It should be understood that the communications device 1000 shown in FIG. 10 is merely an example. The communications device in this embodiment of this application may further include another module or unit, or a module with a function similar to that of each module in FIG. 10, or may not necessarily include all modules in FIG. 10.

A data processing apparatus 1010 included in the communications device 1000 may be the data processing apparatus 600 shown in FIG. 6, or may be the data processing apparatus 800 shown in FIG. 8. For brevity, details are not described herein.

Figure 11:
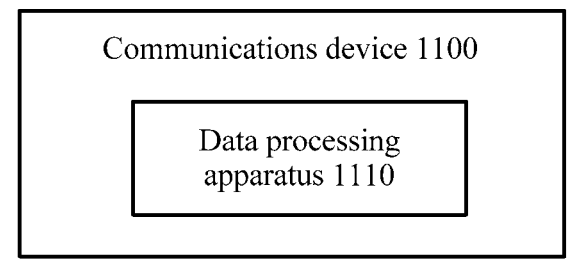
FIG. 11 is a schematic structural diagram of a communications device according to another embodiment of this application.

FIG. 11 is a schematic structural diagram of a communications device according to an embodiment of this application. It should be understood that the communications device 1100 shown in FIG. 11 is merely an example. The communications device in this embodiment of this application may further include another module or unit, or a module with a function similar to that of each module in FIG. 11, or may not necessarily include all modules in FIG. 11.

A data processing apparatus 1110 included in the communications device 1100 may be the data processing apparatus 700 shown in FIG. 7, or may be the data processing apparatus 900 shown in FIG. 9. For brevity, details are not described herein.

A person of ordinary skill in the art may be aware that, the units and algorithm steps in the examples described with reference to the embodiments disclosed in this specification can be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the system, apparatus, and unit, refer to a corresponding process in the method embodiments. Details are not described herein again.

In the several embodiments provided in this application, it should be understood that the disclosed system, apparatus, and method may be implemented in other manners. For example, the described apparatus embodiments are merely examples. For example, the unit division is merely logical function division. There may be another division manner in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual requirements to achieve the objectives of the solutions of the embodiments.

In addition, functional units in the embodiments of this application may be integrated into one processing unit, or each of the units may exist alone physically, or two or more units are integrated into one unit.

When the functions are implemented in a form of a software functional unit and sold or used as an independent product, the functions may be stored in a computer-readable storage medium. Based on such an understanding, the technical solutions of this application essentially, or the part contributing to the prior art, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of this application. The foregoing storage medium includes: any medium that can store program code, such as a USB flash drive, a removable hard disk, a read-only memory (ROM), a random access memory (RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A data processing method, comprising:
    coding, by an electronic device, a first bit sequence based on a redundant bit column in a first low-density parity-check (LDPC) base matrix, to obtain a second bit sequence, wherein the first bit sequence comprises a first information bit and a first padding bit, and the second bit sequence comprises a second information bit and a redundant bit; and
    storing, by the electronic device, the second bit sequence in a circular buffer.

2. The data processing method according to claim 1, wherein the coding the first bit sequence comprises:
    coding the first bit sequence further based on a first information bit column in the LDPC base matrix, wherein the first information bit column is a column corresponding to the first information bit in the first LDPC base matrix.

3. The data processing method according to claim 2, wherein the data processing method further comprises:
    determining a length F of the first padding bit based on a length K of the first information bit and a shortest input sequence length that is in an input sequence length set $\{K_0, K_1, \ldots, K_i, \ldots\}$ and that is greater than K, wherein $K_i = z_i \cdot k$, k is a quantity of information bit columns in the first LDPC base matrix, and $z_i$ belongs to an extension factor set $\{z_0, z_1, z_i, \ldots\}$ supported by the first LDPC base matrix; and
    padding the first information bit with the first padding bit whose length is F, to obtain the first bit sequence.

4. The data processing method according to claim 3, wherein the coding the first bit sequence based on a redundant bit column and a first information bit column that are in the first LDPC base matrix comprises:
    deleting a column other than the first information bit column and the redundant bit column in the first LDPC base matrix based on the length F of the first padding bit and a first extension factor, to obtain a second LDPC base matrix, wherein the first extension factor is an extension factor corresponding to the shortest input sequence length in the extension factor set $\{z_0, z_1, \ldots, z_i, \ldots\}$; and
    coding, based on the first extension factor and the second LDPC base matrix, the first information bit and a bit that is in the first padding bit and that corresponds to the first information bit column.

5. The data processing method according to claim 2, wherein the data processing method further comprises:
    determining a first extension factor and a length F of the first padding bit based on a quantity of information bit columns in the first LDPC base matrix, a maximum column-deleting quantity supported by the first LDPC base matrix, an extension factor set supported by the first LDPC base matrix, and a length of the first information bit; and
    padding the first information bit with the first padding bit whose length is F, to obtain the first bit sequence.

6. The data processing method according to claim 5, wherein the coding the first bit sequence based on a redundant bit column and a first information bit column that are in the first LDPC base matrix comprises:
    deleting a column other than the first information bit column and the redundant bit column in the first LDPC base matrix based on the quantity of information bit columns in the first LDPC base matrix, the length of the first information bit, and the first extension factor, to obtain a second LDPC base matrix; and
    coding, based on the first extension factor and the second LDPC base matrix, the first information bit and a bit that is in the first padding bit and that corresponds to the first information bit column.

7. A data processing method, comprising:
    obtaining, by an electronic device, soft information of a third bit sequence, wherein the third bit sequence is selected by a transmit end from a circular buffer of the transmit end, bits stored in the circular buffer comprise at least a part of a second bit sequence, the second bit sequence is obtained by the transmit end by coding a first bit sequence, the first bit sequence comprises a first information bit and a first padding bit, and the second bit sequence comprises a second information bit and a redundant bit;
    storing, by the electronic device, the soft information in a soft information buffer;
    adding, by the electronic device, padding information to first soft information, to obtain second soft information, wherein the first soft information is the soft information in the soft information buffer; and
    decoding, by the electronic device, the second soft information.

8. The data processing method according to claim 7, wherein the decoding the second soft information comprises:
    decoding the second soft information based on a redundant bit column and a first information bit column that are in a first LDPC base matrix, wherein the first information bit column is a column corresponding to the first information bit in the first LDPC base matrix.

9. The data processing method according to claim 8, wherein the adding padding information to first soft information, to obtain second soft information comprises:

determining a length F of the padding information based on a length K of the first soft information and a shortest input sequence length that is in an input sequence length set $\{K_0, K_1, \ldots, K_i, \ldots\}$ and that is greater than K, wherein $K_i = z_i \cdot k$, k is a quantity of information bit columns in the first LDPC base matrix, and $z_i$ belongs to an extension factor set $\{z_0, z_1, \ldots, z_i, \ldots\}$ supported by the first LDPC base matrix; and padding the first soft information with the padding information whose length is F, to obtain the second soft information.

10. The data processing method according to claim 9, wherein the decoding the second soft information based on a redundant bit and a first information bit column that are in the first LDPC base matrix comprises:

deleting a column other than the first information bit column and the redundant bit column in the first LDPC base matrix based on the length F of the padding information and a first extension factor, to obtain a second LDPC base matrix, wherein the first extension factor is an extension factor corresponding to the shortest input sequence length in the extension factor set $\{z_0, z_1, \ldots, z_i, \ldots\}$; and decoding, based on the first extension factor and the second LDPC base matrix, the first soft information and information that is in the padding information and that corresponds to the first information bit column.

11. The data processing method according to claim 8, wherein the adding padding information to first soft information, to obtain second soft information comprises:

determining a first extension factor and a length F of the padding information based on a quantity of information bit columns in the first LDPC base matrix, a maximum column-deleting quantity supported by the first LDPC base matrix, an extension factor set supported by the first LDPC base matrix, and a length of the first soft information; and padding the first soft information with the padding information whose length is F, to obtain the second soft information.

12. The data processing method according to claim 11, wherein the decoding the second soft information based on a redundant bit and a first information bit column that are in the first LDPC base matrix comprises:

deleting a column other than the first information bit column and the redundant bit column in the first LDPC base matrix based on the quantity of information bit columns in the first LDPC base matrix, the length of the first soft information, and the first extension factor, to obtain a second LDPC base matrix; and decoding, based on the first extension factor and the second LDPC base matrix, the first soft information and information that is in the padding information and that corresponds to the first information bit column.

13. A data processing apparatus, comprising:

a non-transitory memory storage comprising instructions; and one or more hardware processors in communication with the non-transitory memory storage, wherein the one or more hardware processors execute the instructions to:

code a first bit sequence based on a redundant bit column in a first low-density parity-check (LDPC) base matrix, to obtain a second bit sequence, wherein the first bit sequence comprises a first information bit and a first padding bit, and the second bit sequence comprises a second information bit and a redundant bit; and store at least a part of the second bit sequence in a circular buffer.

14. The data processing apparatus according to claim 13, wherein the one or more hardware processors execute the instructions to code the first bit sequence further based on a first information bit column in the first LDPC base matrix, wherein the first information bit column is a column corresponding to the first information bit in the first LDPC base matrix.

15. The data processing apparatus according to claim 14, wherein the one or more hardware processors execute the instructions to:

determine a length F of the first padding bit based on a length K of the first information bit and a shortest input sequence length that is in an input sequence length set $\{K_0, K_1, \ldots, K_i, \ldots\}$ and that is greater than K, wherein $K_i = z_i \cdot k$, k is a quantity of information bit columns in the first LDPC base matrix, and $z_i$ belongs to an extension factor set $\{z_0, z_1, \ldots, z_i, \ldots\}$ supported by the first LDPC base matrix; and pad the first information bit with the first padding bit whose length is F, to obtain the first bit sequence.

16. The data processing apparatus according to claim 15, wherein the one or more hardware processors execute the instructions to:

delete a column other than the first information bit column and the redundant bit column in the first LDPC base matrix based on the length F of the first padding bit and a first extension factor, to obtain a second LDPC base matrix, wherein the first extension factor is an extension factor corresponding to the shortest input sequence length in the extension factor set $\{z_0, z_1, \ldots, z_i, \ldots\}$; and code, based on the first extension factor and the second LDPC base matrix, the first information bit and a bit that is in the first padding bit and that corresponds to the first information bit column.

17. The data processing apparatus according to claim 14, wherein the one or more hardware processors execute the instructions to:

determine a first extension factor and a length F of the first padding bit based on a quantity of information bit columns in the first LDPC base matrix, a maximum column-deleting quantity supported by the first LDPC base matrix, an extension factor set supported by the first LDPC base matrix, and a length of the first information bit; and pad the first information bit with the first padding bit whose length is F, to obtain the first bit sequence.

18. The data processing apparatus according to claim 17, wherein the one or more hardware processors execute the instructions to:

delete a column other than the first information bit column and the redundant bit column in the first LDPC base matrix based on the quantity of information bit columns in the first LDPC base matrix, the length of the first information bit, and the first extension factor, to obtain a second LDPC base matrix; and code, based on the first extension factor and the second LDPC base matrix, the first information bit and a bit that is in the first padding bit and that corresponds to the first information bit column.

19. A data processing apparatus, comprising:
a non-transitory memory storage comprising instructions; and
one or more hardware processors in communication with the non-transitory memory storage, wherein the one or more hardware processors execute the instructions to:
obtain soft information of a third bit sequence, wherein the third bit sequence is selected by a transmit end from a circular buffer of the transmit end, bits stored in the circular buffer comprise a part or all of a second bit sequence, the second bit sequence is obtained by the transmit end by coding a first bit sequence, the first bit sequence comprises a first information bit and a first padding bit, and the second bit sequence comprises a second information bit and a redundant bit;
store the soft information in a soft information buffer;
add padding information to first soft information, to obtain second soft information, wherein the first soft information is the soft information in the soft information buffer; and
decode the second soft information.

20. The data processing apparatus according to claim 19, wherein the one or more hardware processors execute the instructions to decode the second soft information based on a redundant bit and a first information bit column that are in a first LDPC base matrix, wherein the first information bit column is a column corresponding to the first information bit in the first LDPC base matrix.

* * * * *